(12) United States Patent
Doll et al.

(10) Patent No.: US 8,012,791 B2
(45) Date of Patent: Sep. 6, 2011

(54) ELECTRONIC COMPONENTS AND METHODS FOR PRODUCING SAME

(75) Inventors: Theodor Doll, Alzey (DE); Susanne Scheinert, Unterpörlitz (DE); Axel Scherer, Laguna Beach, CA (US); Gernot Paasch, Pirna (DE)

(73) Assignee: Cantrele Telecom Co., L.L.C., Wilmington, DE (US)

( * ) Notice: Subject to any disclaimer, the term of this patent is extended or adjusted under 35 U.S.C. 154(b) by 0 days.

(21) Appl. No.: 10/570,839

(22) PCT Filed: Sep. 1, 2004

(86) PCT No.: PCT/EP2004/009729
§ 371 (c)(1),
(2), (4) Date: Dec. 18, 2006

(87) PCT Pub. No.: WO2005/024972
PCT Pub. Date: Mar. 17, 2005

(65) Prior Publication Data
US 2007/0087468 A1    Apr. 19, 2007

(30) Foreign Application Priority Data
Sep. 3, 2003    (DE) .................... 103 40 926

(51) Int. Cl.
*H01L 51/40*    (2006.01)
(52) U.S. Cl. .................... 438/99; 257/E51.006
(58) Field of Classification Search .................... 257/40, 257/E51.001–E51.052; 438/99; 977/893
See application file for complete search history.

(56) References Cited

U.S. PATENT DOCUMENTS

| | | | | |
|---|---|---|---|---|
| 3,369,159 | A | * | 2/1968 | Parker et al. .................... 257/288 |
| 4,180,604 | A | | 12/1979 | Feng et al. |
| 5,091,288 | A | | 2/1992 | Zapella et al. |
| 5,587,328 | A | | 12/1996 | Yoshida .................... 437/40 |
| 6,326,640 | B1 | * | 12/2001 | Shi et al. .................... 257/40 |
| 6,423,567 | B1 | | 7/2002 | Lüdemann et al. .................... 438/83 |
| 6,433,357 | B1 | * | 8/2002 | Kuijk et al. .................... 257/40 |
| 6,720,572 | B1 | * | 4/2004 | Jackson et al. .................... 257/40 |
| 6,740,900 | B2 | * | 5/2004 | Hirai .................... 257/40 |
| 6,794,220 | B2 | | 9/2004 | Hirai et al. .................... 438/99 |

(Continued)

FOREIGN PATENT DOCUMENTS

DE    19819200    11/1999

(Continued)

OTHER PUBLICATIONS

Higuchi, H., et al. "Free Volume Quantities and Viscoelasticity of Polymer Glasses." J. Poly. Sci., Part B: Poly. Phys., vol. 34 (1996): pp. 1423-1426.*

(Continued)

*Primary Examiner* — Matthew W Such
(74) *Attorney, Agent, or Firm* — Sterne, Kessler, Goldstein & Fox P.L.L.C.

(57) ABSTRACT

The invention relates to a method for producing electronic components comprising adjacent electrodes interspaced at distances ranging between 10 nanometers and several micrometers on a substrate of any type. According to the invention, the electrodes are structured by means of overlapping edges on the deposited layer or by undercutting the deposited layers. The electronic components are then produced either in the conventional manner or using a lithographic process from the underside of the transparent substrate and finally by means of a succession of known method steps for the production of electronic components.

3 Claims, 5 Drawing Sheets

U.S. PATENT DOCUMENTS

| | | | |
|---|---|---|---|
| 6,818,486 B2 * | 11/2004 | Eccleston | 438/151 |
| 7,435,992 B2 * | 10/2008 | Choi et al. | 257/72 |
| 7,445,954 B2 * | 11/2008 | Bonfiglio et al. | 438/99 |
| 2002/0164884 A1 * | 11/2002 | Lishan | 438/739 |
| 2003/0059987 A1 * | 3/2003 | Sirringhaus et al. | 438/149 |
| 2003/0080426 A1 * | 5/2003 | Klauk et al. | 257/744 |
| 2003/0183915 A1 * | 10/2003 | Scheifers et al. | 257/682 |
| 2003/0230747 A1 * | 12/2003 | Ostergard | 257/40 |
| 2004/0075155 A1 * | 4/2004 | Huang et al. | 257/503 |
| 2004/0126935 A1 * | 7/2004 | Zhang et al. | 438/142 |

FOREIGN PATENT DOCUMENTS

| | | |
|---|---|---|
| DE | 19819200 A1 | 11/1999 |
| DE | 20031040926 | 3/2005 |
| EP | 0718877 A | 6/1996 |
| EP | 1291932 A | 3/2003 |
| EP | 20040764691 | 6/2006 |
| JP | 06333952 A * | 12/1994 |
| WO | WO 0195384 A1 * | 12/2001 |
| WO | WO 03056640 A1 * | 7/2003 |

OTHER PUBLICATIONS

McGehee, M.D., et al. "Microplanar Polymer Light-Emitting Diodes." Synth. Met., vol. 85 (1997): pp. 1233-1234.*

Scheinert, S., et al. "Organic Field-Effect Transistors With Nonlithographically Defined Submicrometer Channel Length." Appl. Phys. Lett., vol. 84, No. 22 (May 31, 2004): pp. 4427-4429.*

Garnier, F., et al. "All-Polymer Field-Effect Transistor Realized by Printing Techniques." Science, vol. 265 (1994): pp. 1684-1686.*

Garnier, F., et al. "Vertical Device Architecture by Molding of Organic-Based Thin Film Transistor." Appl. Phys. Lett., vol. 73 (1998): pp. 1721-1723.*

Goodman, A.M. "Photoemission of Electrons from Silicon and Gold into Silicon Dioxide." Phys. Rev., vol. 144, No. 2 (Apr. 15, 1966): pp. 588-593.*

Zaumseil, J., et al. "Nanoscale Organic Transistors that use Source/Drain Electrodes Supported by High Resolution Rubber Stamps." Appl. Phys. Lett., vol. 82, No. 5 (Feb. 3, 2003): pp. 793-795.*

International Search Report for Application No. PCT/EP2004/009729 Mailed Apr. 25, 2005 (3 pages).

Malenfant, Patrick R. L. et al.: "N-type organic thin-film transistor with high field-effect mobility based on a N,N' dialkyl—3,4,9,10-perylene tetracarboxylic diimide derivative" Applied Physics Letters, American Institute of Physics, vol. 80, No. 14, Apr. 8, 2002, pp. 2517-2519, XP012030509 New York, US ISSN: 0003-6951 figure 1.

Natalie Stutzmann, Richard H. Friend, Henning Sirringhaus; "Self-Aligned, Vertical-Channel, Polymer Field-Effect Transistors"; Science; Mar. 21, 2003; 1881-1884; vol. 299.

Malenfant et al.; "*N*-type organic thin-film transistor with high field-effect mobility based on a N,N' -dialkyl-3,4,9,10-perylene tetracarboxylic diimide derivative"; American Institute of Physics; Appl. Phys. Lett.; Apr. 8, 2002; 2517-2519; vol. 80, No. 14.

Office Action in German Appln. No. 10340926.2, prepared Apr. 14, 2010, 4 pgs.

Uchikoga et al., "Photolithographic Pattern Transformation by Backside Exposure in a-Si:H Thin-Film Transistor Liquid Crystal Displays," *Jpn. J. Applied Physics* 34:486-487 (1995).

\* cited by examiner

A

B

C

D

A

B

ELECTRONIC COMPONENTS AND METHODS FOR PRODUCING SAME

CROSS-REFERENCE TO RELATED APPLICATIONS

This application is the National Stage of International Application No. PCT/EP04/09729, filed Sep. 1, 2004.

BACKGROUND

1. Field of the Invention

The invention relates to several methods for producing electronic components with adjacent electrodes tightly interspaced at distances ranging between 10 nanometers and several micrometers on a substrate of any type that may also be a polymer film or glass, except for substrates for standard semiconductor technology such as Si, $SiO_2$, $Si_3N_4$, GaAs, $Al_2O_3$.

The methods based on the invention find application in the extremely low-cost and simple manufacture of electronic components requiring the smallest electrode separation such as, for example, molecular electronics, polymer field-effect transistors or field emitters.

2. Description of Related Art

The State of the Art describes various lithographic procedures (DUV or electron-beam lithography) by means of which the shortest possible length of the electrically active channel within the transistor (channel length), and thereby a high operating speed, may be achieved. However, these high-resolution lithographic procedures are very cost-intensive and therefore not suitable for the application realms of low-performance, low-cost electronics.

Also, a method per Friend, published in SCIENCE 299, 1881 (2003), is known in which a vertical configuration of two lateral metallization layers separated by an insulating polymer layer is used in order to provide short channels in polymer transistors. A blade cuts into this sandwich so that closely adjacent electrode connections $M_{e1}$ and $M_{e2}$ are present at the sidewalls. The polymer semi-conductor ('active layer') is deposited over this V-slot, and then made into a transistor.

The disadvantage here, however, is that the material is deformed when pressed into the cut slot, and the opposing sidewalls of the channel are positioned very close to each other. The active layer subsequently deposited cannot be evenly distributed because of meniscus formation.

A method to produce contact structures within semi-conductor components is knows from DE 198 19 200 A1 according to which a recess is formed in the substrate using a mask. Two separate electrode structures may be applied to it by deposition of a conducting material and creation of flanks for the recess.

BRIEF SUMMARY

It is therefore the task of the invention to develop one or more methods with which closely adjacent electrodes may be structured on a substrate in a simple, low-cost manner, and thus allow the production of electronic components with the least possible technological expense.

In principle, structuring of the electrodes is performed by overlapping the edges on the deposited layer, or by means of undercutting the deposited layer. Finishing of the electronic components occurs subsequently either in a conventional manner or by means of a lithographic process from the underside of the transparent substrate and subsequent succession of known procedure steps to produce electronic components.

BRIEF DESCRIPTION OF THE SEVERAL VIEWS OF THE DRAWINGS

The invention will be described in more detail using Figures of a field-effect transistor, which show.

DETAILED DESCRIPTION

Figure 1:
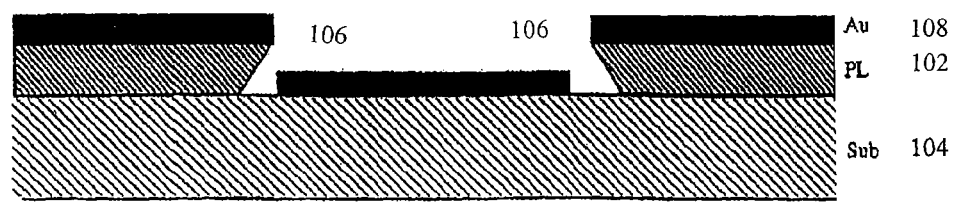
FIG. 1 depicts structuring of electrodes by overlapping the deposited layer.
Figure 1:
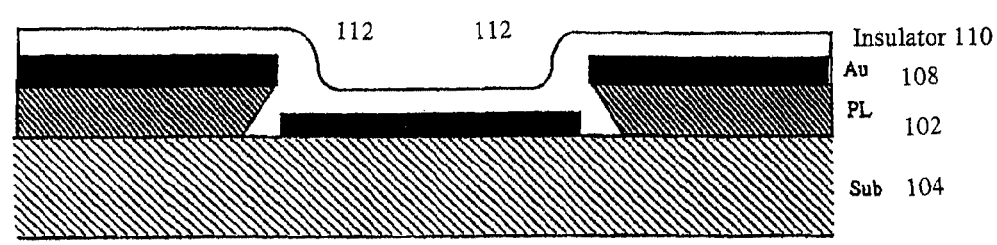
Figure 1:
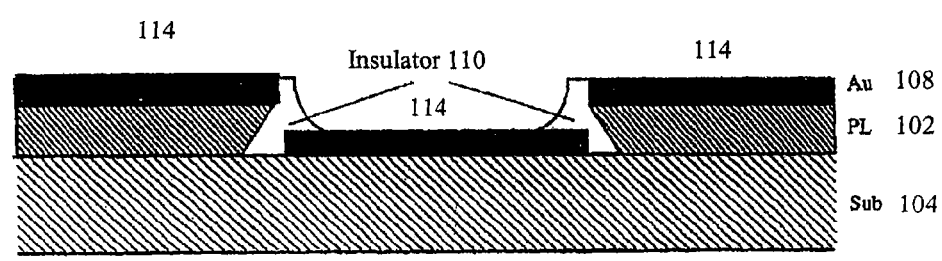
Figure 1:
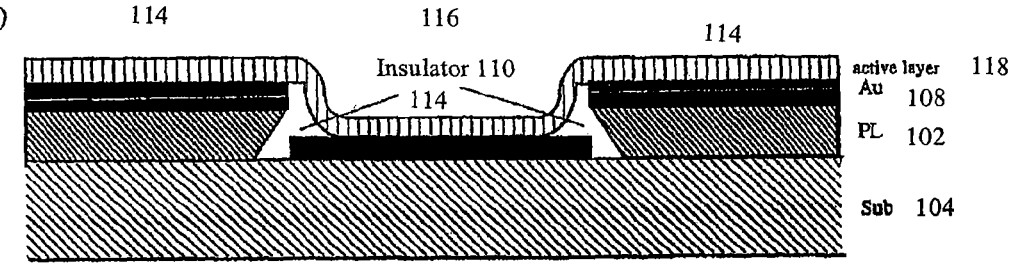

FIG. 1 shows the steps of a vertical production method. A photo lacquer 102 was deposited on a substrate 104 and was so structured that overlapping edges arise 106 on the photo lacquer 102. Subsequently, a metal vapor 108, preferably Chromium or Gold, is deposited. The insulator 110 applied in the subsequent procedure step covers the entire surface. Flat edges 112 are formed on the overlapping edges 106 of the photo lacquer 102 because of meniscus formation during the subsequent etching process as an inverse of the overlaps. The substrate 104 with its mounted and insulated electrodes 114 thus produced may be completed to produce a field-effect transistor 116 in subsequent procedure steps such as scattering the organic semiconductor ('active layer') 118, deposition of another insulator, and gate metallization and exposure of the electrodes 114.

Figure 2:
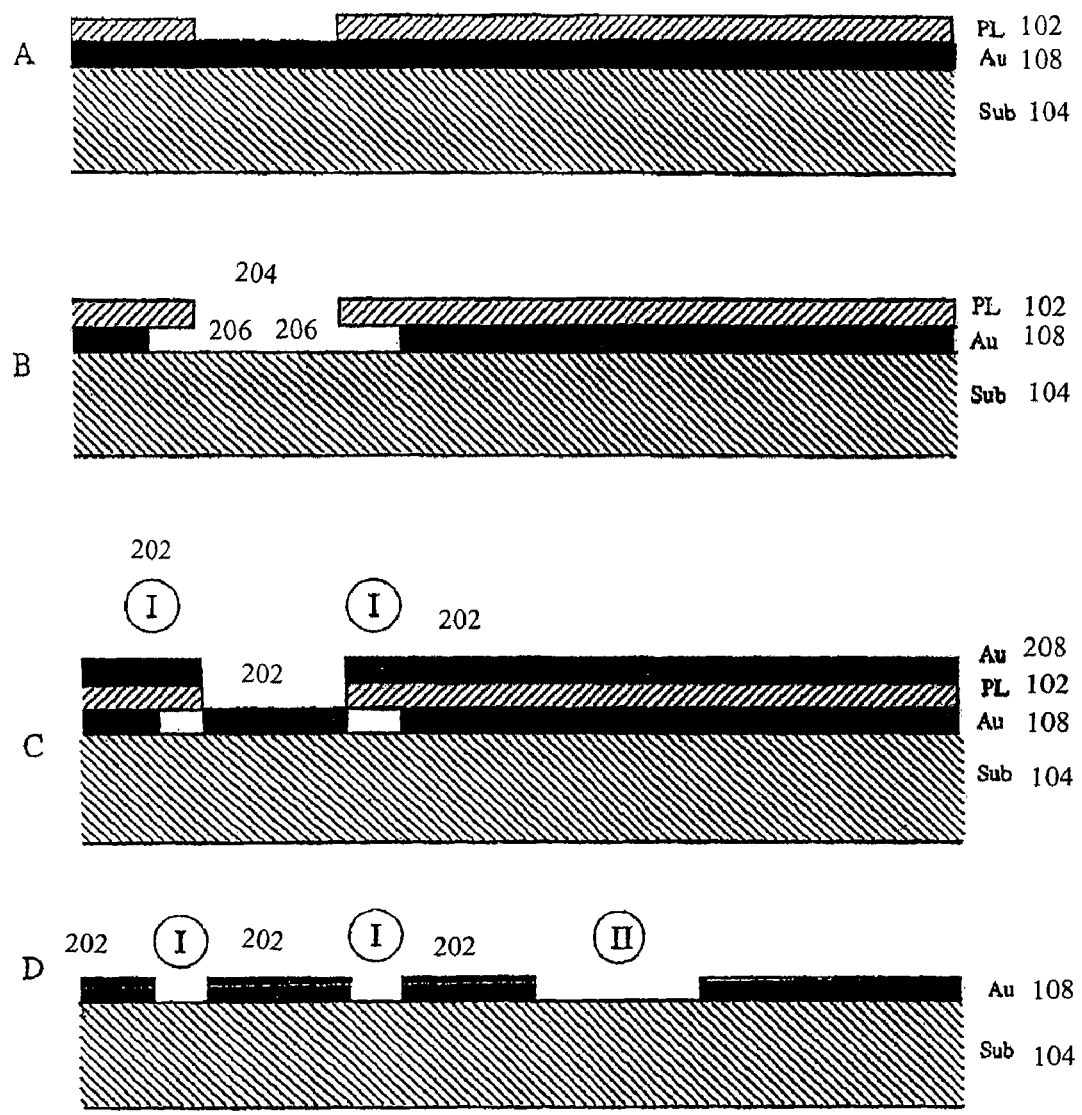
FIG. 2 depicts structuring of electrodes by undercutting a deposited layer.

FIG. 2 shows another method to structure closely adjacent electrodes 202 on a substrate 104. In this method, a metal vapor 108, preferably Chromium or Gold, is deposited. Photo lacquer 102 is then deposited onto this metal layer 108, and is structured according to the components to be produced. For example, as shown in FIG. 2, a portion of the surface of metal layer 108 does not have photo lacquer 102 thereon. In the subsequent method step, the metal 108 is etched at all points 204 not covered by the photo lacquer 102, whereby the metal 108 is undercut at the edges of the photo lacquer 102 in a controlled manner.

Figure 3:
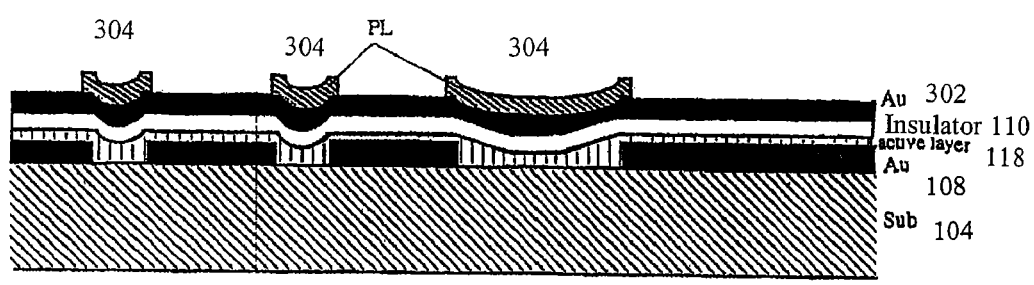
FIG. 3 depicts production of a transistor using known methods.
Figure 3:
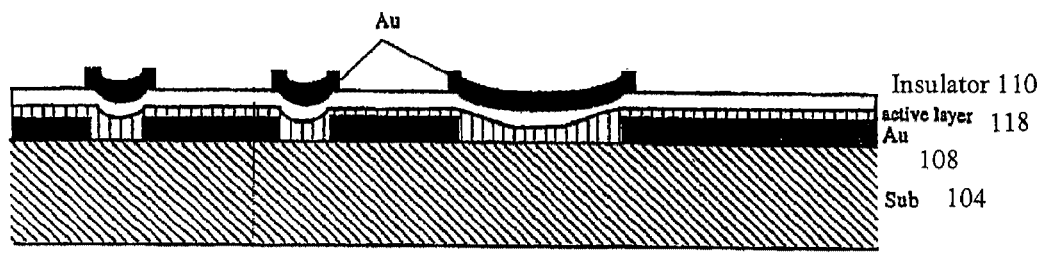

Overhangs 206 thus are formed on each photo lacquer 102. Subsequently, the structure thus achieved again receives a deposit of metal vapor 208. For example, as shown in FIG. 2, a surface of photo lacquer 102 and an exposed portion of substrate 104 where metal layer 108 was etched away are exposed to the deposit of metal vapor 208 so that second metal layer 208 is formed on the surface of photo lacquer 102 and the exposed portion of substrate 104 where the metal layer 108 was etched away, except in a space between overhang 206 and substrate 104. The electrodes 202 are separated from each other by means of the undercutting. After the photo lacquer 102 is removed (lift off) with its deposited metal layer 208, the desired electronic component (field-effect transistor) 116 may be completed using known method steps by scattering an organic semi-conductor ('active layer') 118 and an insulator 110, or deposition of gate metallization 302 and exposure-etching 304 of the connectors (FIG. 3). To the extent the deeper-positioned electrodes are to be formed, for example, the gates of a transistor, they are purposefully so covered with an insulator that the recess is also closed by means of it.

Figure 4:
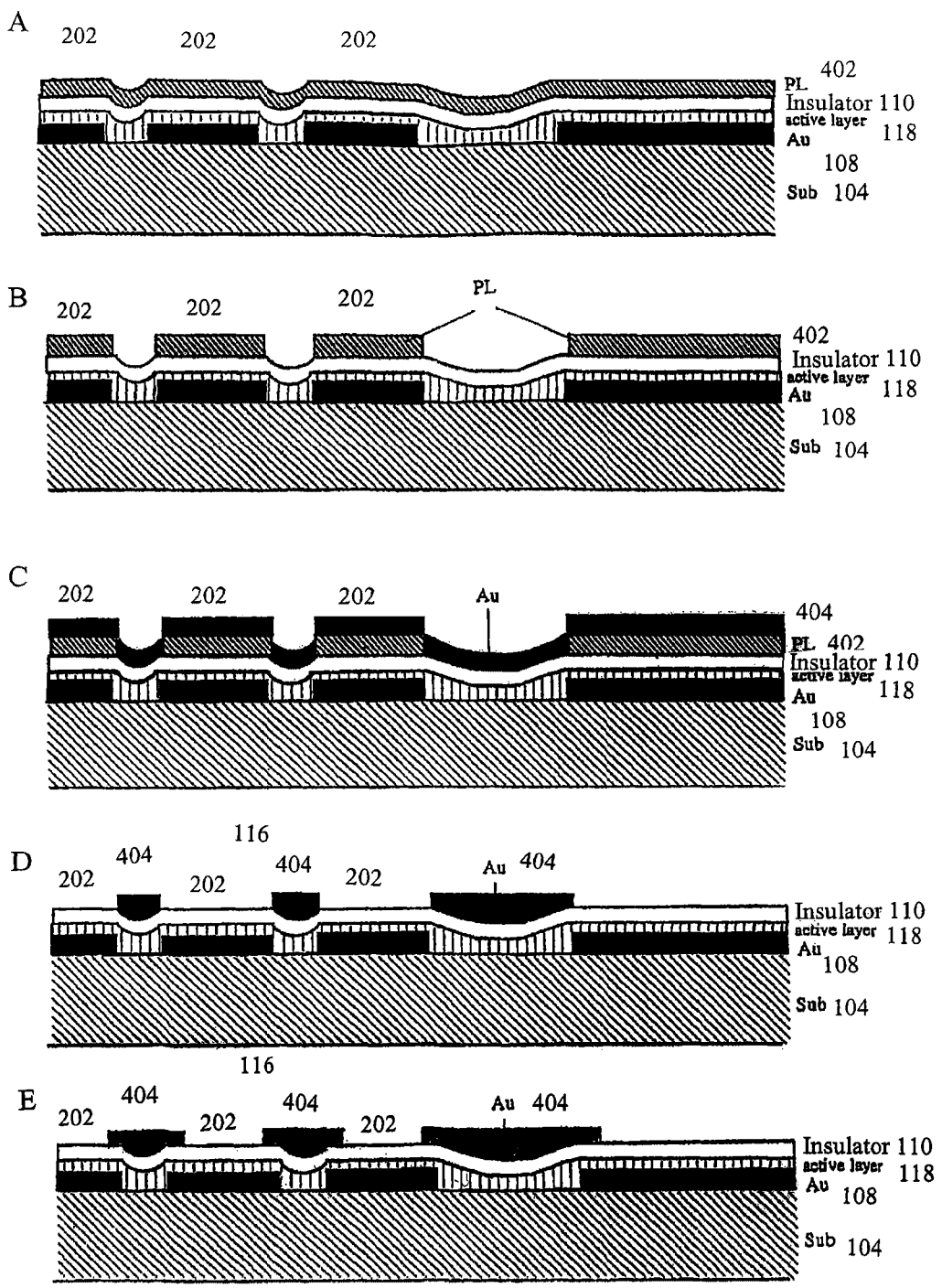
FIG. 4 depicts production method for a field-effect transistor using photo-lithography from the underside of the substrate.

FIGS. 2 and 4 show a production method for an electronic component with closely adjacent electrodes 202 on a substrate 104 for the example of production of a field-effect transistor 116. The structuring of these closely adjacent electrodes 202 results as in the above-mentioned method (Method 2) up to the point of scattering the insulator 110. A photo lacquer 402 is subsequently deposited onto this insulator 110, and photolithography is performed from the underside of the substrate 104. An absolutely necessary pre-condition for this is, however, that the substrate 104, the active layer 118, and the insulator 110 must be transparent. After this lithographic process, a subsequent metal-vapor layer 404 is deposited. In the final step, the remaining photo lacquer 402 with its deposited metal layer 404 is removed (e.g., by a lift-off process).

In order to avoid this lift-off process at the sub-micrometer level, the metal layer 404 may alternatively be structured by deposition of a suitable mask and etching to a width wider than the channel length. The gate sections positioned above the closely-adjacent electrodes 202 are separated by the photo lacquer 402 remaining under them to the point that the parasitic gate capacitances remain small as for field oxide (Diagram E in FIG. 4).

Figure 5:
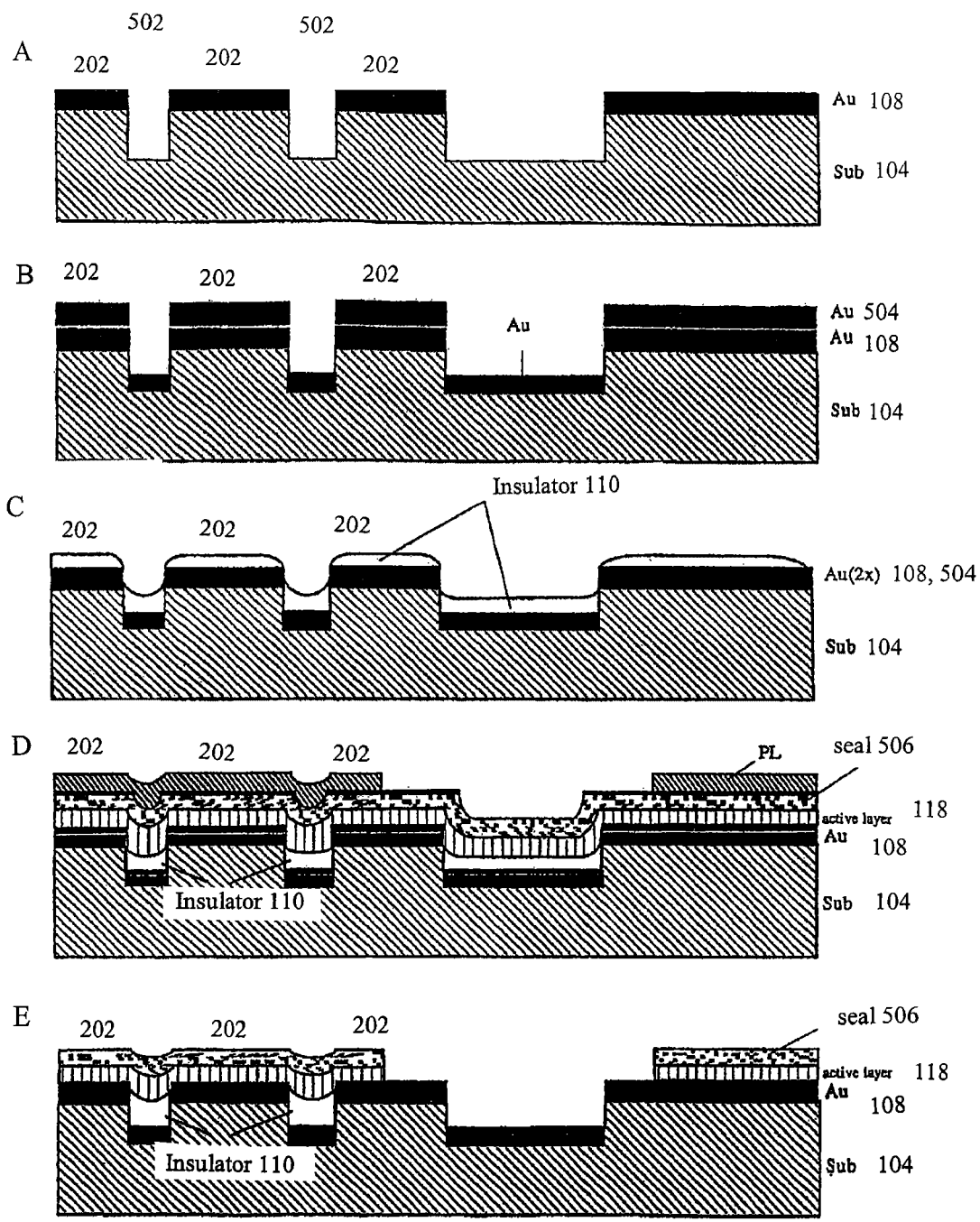
FIG. 5 depicts production of a field-effect transistor by etching into the depth of the substrate.

Another method to produce electronic components with closely adjacent electrodes 202 on a substrate 104 is shown in FIGS. 2 and 5 for the example of the production of a field-effect transistor 116. The structuring of these closely adjacent electrodes 202 is performed as in the above-described method (Method 2). Holes or grooves 502 for one or more gates buried are etched into those positions of the substrate 104 at which no metal layer 108 is present. For example, as shown in FIG. 5, a hole 502 is etched into substrate 104 at a position other than a position of metal layer 108 and second metal layer 208 (from FIG. 2). In the subsequent method step, a third vapor-metal layer 504 is deposited to the entire surface. For example, as shown in FIG. 5, third metal layer 504 is deposited onto substrate 104, metal layer 108, and second metal layer 208 (from FIG. 2). Thin gate metallizations are deposited in the holes or grooves 502. An insulator 110 is subsequently deposited on the surface thus produced. For example, as shown in FIG. 5, insulator 110 is applied to third metal layer 504. The holes or grooves 502 are partially filled by the insulator 110. The insulation 110 is etched away on the upper side of the substrate 104 using, for example, a plasma process, and is only partially etched away in the holes or grooves 502 because of the aspect ratios. For example, as shown in FIG. 5, a portion of insulator 110 at the position of metal layer 108 and second metal layer 208 (from FIG. 2) is etched. The organic semiconductor ('active layer') 118 is subsequently applied. For example, as shown in FIG. 5, organic semiconductor 118 is applied to third metal layer 504 and insulator 110. After the surface of the substrate 104 is sealed 506, the contacts of the buried gates must be exposed by means of a photolithographic process. For example, as shown in FIG. 5, sealing layer 506 is applied to organic semiconductor 118.

The methods based on the invention allow the production of electronic components with closely adjacent electrodes 202 whereby the structuring of the electrodes 202 is achieved by means of a single-mask process. Classical micro-structuring techniques may be used for this. Use of these methods allows simple, low-cost production of electronic components. The electronic components produced by the methods based on the invention may be reproduced better and more simply.

These methods may be applied advantageously in molecular electronics, to produce polymer field-effect transistors 116, field emitters, or other electronic components.

The invention claimed is:

1. A method for producing, on a substrate, an electronic component with closely adjacent electrodes, the method comprising:
    depositing a first metal layer onto the substrate;
    structuring a first photo lacquer on a surface of the first metal layer, wherein a portion of the surface of the first metal layer does not have the first photo lacquer thereon;
    etching the portion of the surface of the first metal layer not having the first photo lacquer;
    undercut etching the first metal layer so that an overhang is defined by the first photo lacquer;
    exposing, to a metal vapor, a surface of the first photo lacquer and an exposed portion of the substrate where the first metal layer was etched away so that a second metal layer is formed on the surface of the first photo lacquer and the exposed portion of the substrate where the first metal layer was etched away except in a space between the overhang and the substrate;
    removing the second metal layer from the surface of the first photo lacquer and removing the first photo lacquer;
    etching a hole into the substrate at a position other than a position of the first metal layer and the second metal layer;
    depositing a third metal layer onto the substrate, the first metal layer, and the second metal layer;
    applying an insulator onto the third metal layer;
    applying an organic semiconductor onto the third metal layer and the insulator; and
    applying a sealing layer onto the organic semiconductor.

2. The method of claim 1, further comprising:
    making the third metal layer from gold.

3. The method of claim 1, wherein said structuring comprises structuring the first photo lacquer on the surface of the first metal layer so that the first photo lacquer is in direct physical contact with the surface of the first metal layer.

* * * * *